(12) United States Patent
Chang et al.

(10) Patent No.: US 11,197,384 B1
(45) Date of Patent: Dec. 7, 2021

(54) TOOL-LESS LATCH SYSTEM FOR A NODE SLED

(71) Applicant: Quanta Computer Inc., Taoyuan (TW)

(72) Inventors: Chun Chang, Taoyuan (TW);
Shih-Hsuan Hu, Taoyuan (TW);
Wei-Cheng Tseng, Taoyuan (TW);
Cheng-Feng Tsai, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/948,206

(22) Filed: Sep. 8, 2020

Related U.S. Application Data

(60) Provisional application No. 63/045,708, filed on Jun. 29, 2020.

(51) Int. Cl.
| | | |
|---|---|---|
| *G06F 1/16* | (2006.01) | |
| *H05K 5/00* | (2006.01) | |
| *H05K 7/00* | (2006.01) | |
| *H05K 7/14* | (2006.01) | |
| *H05K 7/20* | (2006.01) | |

(52) U.S. Cl.
CPC ....... *H05K 7/1401* (2013.01); *H05K 7/20136* (2013.01); *H05K 7/20718* (2013.01)

(58) Field of Classification Search
CPC .......... H05K 7/00; H05K 7/14; H05K 7/1421; H05K 7/1422; H05K 7/1427; H05K 7/1435; H05K 7/1488; H05K 7/1487; G06F 1/187; G06F 1/18; G06F 1/188; G06F 1/183
See application file for complete search history.

(56) References Cited

U.S. PATENT DOCUMENTS

| | | | |
|---|---|---|---|
| 2015/0008589 A1* | 1/2015 | Suzuki | H01L 23/481 257/774 |
| 2015/0270192 A1* | 9/2015 | Bar | H01L 24/17 257/706 |
| 2015/0340413 A1* | 11/2015 | Lee | H01L 51/5209 257/40 |
| 2016/0037630 A1* | 2/2016 | Okamoto | H05K 3/4602 361/760 |
| 2016/0095227 A1* | 3/2016 | Takano | H05K 3/0014 156/247 |
| 2016/0126304 A1* | 5/2016 | Cho | H01L 51/5228 257/40 |
| 2016/0211316 A1* | 7/2016 | Oh | H01L 51/56 |
| 2017/0033166 A1* | 2/2017 | Shim | H01L 27/3279 |
| 2017/0125725 A1* | 5/2017 | Paek | H01L 51/0022 |
| 2017/0133620 A1* | 5/2017 | Lee | H01L 27/3246 |

(Continued)

*Primary Examiner* — Anthony M Haughton
(74) *Attorney, Agent, or Firm* — Nixon Peabody LLP

(57) ABSTRACT

A node sled is for installation into an electronics chassis. The node sled includes a housing that contains electronic components. The housing includes a front bracket and a catch mechanism. The node sled further includes a lever having an engagement arm, an actuation arm, and a mounting portion. The mounting portion is pivotably mounted to the housing. The actuation arm is manually moveable between a first position in which the engagement arm locks the node sled into the electronics chassis, and a second position in which the engagement arm is released from the electronics chassis. The actuation arm has a latch that engages the catch mechanism in response to the actuation arm being in the first position.

20 Claims, 7 Drawing Sheets

(56) References Cited

U.S. PATENT DOCUMENTS

2018/0108781 A1* 4/2018 Fang .................. H01L 51/0011
2018/0331169 A1* 11/2018 Nam .................... H01L 27/124
2019/0287909 A1* 9/2019 Hu ...................... H01L 23/5386

* cited by examiner

TOOL-LESS LATCH SYSTEM FOR A NODE SLED

RELATED APPLICATIONS

The application claims priority under 35 U.S.C. § 119 to U.S. Provisional Application No. 63/045,708, entitled "TOOL-LESS LATCH DESIGN ON SERVER NODE FOR BETTER AIRFLOW," and filed on Jun. 29, 2020. The contents of that application are hereby incorporated by reference in their entirety.

FIELD OF THE INVENTION

The present invention relates generally to a latch system for a node sled, and more specifically, to a lever-latch mechanism that provides a stronger connection to the electronics chassis and uses less space for permitting more airflow through the node sled.

BACKGROUND OF THE INVENTION

Computer enclosures and other types of electronic equipment are often mounted in a vertical rack structure. Within each rack structure, there each are multiple chassis that contain the electronic equipment. This mounting technique is often referred to as "rack mounting" and is frequently used, for example, with server-type computers. A typical data center may have thousands of rack structures.

The electronic equipment within a single chassis may be arranged in multiple nodes, which may be dedicated to certain functions or contain certain types of equipment. Each node is contained with an enclosure and is often referred to as a "node sled." For example, there may be a plurality of computing node sleds and a plurality of storage node sleds. A computing node sled may include a baseboard management controller (BMC), a platform controller hub (PCH), power supplies, and one or more central processing units (CPU). Regardless of the function, each node sled must be mounted to the chassis and provide internal pathways for transferring heat from the electronic components. The chassis commonly includes fans to draw air from the node sleds to transfer the heat through convection.

In prior systems, the node sleds were attached to the chassis via fasteners, such as screws. One benefit of these conventional fastening systems is that they provide for a strong connection between the chassis and the node sled. However, these conventional fastening systems require additional time to remove the node sled from the chassis. They also require the operator to carry a tool to perform the removal and attachment.

To overcome these problems, a tool-less fastening system has been developed that relies on a lever to attach the node sled to the chassis. FIG. 1A illustrates a prior art single-node sled 10 that includes a front input/output (I/O) bracket 12. As shown, a lever 14 is in the locked position in which an engagement arm (not shown) of the lever 14 at the side of the single-node sled 10 would mate with an opening in the chassis. To release the single-node sled 10 from the chassis, a button 16 is pressed, and the lever 14 can be rotated away from the front I/O bracket 12. The single-node sled 10 can then be removed from the chassis. Similarly, FIG. 2A illustrates a prior art dual-node sled 20 that includes a front input/output (I/O) bracket 22 and a lever 24. The dual-node sled 20 is twice the height as the single-node sled 10. To release the dual-node sled 20 from the chassis, a button 26 is pressed and the lever 24 is rotated away from the front I/O bracket 22 to disengage the lever 24 from the chassis.

The button-released lever system in the prior art node sleds presents a few problems. First, because of the heat produced by the electronics contained in the node sleds, it is desirable to maximize the air flow into the front I/O bracket to enhance the heat transfer from the electronics. The button-released lever system in the prior art node sleds utilize critical space on the front I/O bracket, causing less air flow. Second, the button-released lever system also suffers from connection and strength issues. The button can be inadvertently engaged to release the lever. Vibration and shock to the node sled can cause the button to be inadvertently released, or result in damage to the front I/O bracket or to the node sled.

The present disclosure is directed to improved lever mechanism that, among other benefits, provides for easy installation and removal of the node sled, permits increased airflow into the node sled, and decreases the risk of damage or disengagement during shock and vibration.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

According to one aspect of the present disclosure, a node sled is for installation into an electronics chassis. The node sled includes a housing that contains electronic components. The housing includes a front bracket and a catch mechanism. The node sled further includes a lever having an engagement arm, an actuation arm, and a mounting portion. The mounting portion is pivotably mounted to the housing. The actuation arm is manually moveable between a first position in which the engagement arm locks the node sled into the electronics chassis and a second position in which the engagement arm is released from the electronics chassis. The actuation arm has a latch that engages the catch mechanism in response to the actuation arm being in the first position.

According to a configuration of the above implementation, the latch has a release portion and a hook portion. The hook portion engages the catch mechanism in response to the actuation arm being in the first position.

According to another configuration of the above implementation, the latch has a connection region at which the latch is pivotably connected to the engagement arm. The release portion is on one side of the connection region, and the hook portion is on the other side of the connection region.

According to a further configuration of the above implementation, in response to the release portion of the latch being manually actuated, the hook portion disengages from the catch mechanism, and the engagement arm moves toward the second position.

In a further aspect of the above implementation, the lever further includes a spring mechanism to bias the engagement arm of the lever toward the second position.

In yet a further aspect of the above implementation, the mounting portion is pivotably mounted to the front bracket of the housing.

In another aspect of the above implementation, the front bracket is removable from the housing.

According to a further configuration of the above implementation, the node sled also includes a support bracket assembly mounted on an inside wall of the front bracket of the housing. The support bracket assembly includes a pin structure that pivotably mates with an opening in the mounting portion of the lever.

According to another configuration of the above implementation, the support bracket assembly includes a spring mechanism. The spring mechanism causes the actuation arm of the lever to be biased toward the second position.

In yet a further aspect of the above implementation, the lever has a low profile and extends along a bottom edge on the front bracket.

In another aspect of the above implementation, the front bracket includes a plurality of air vents directly above the lever.

According to another configuration of the above implementation, the electronic components include a baseboard management controller. The plurality of air vents is directly adjacent to the baseboard management controller.

According to another configuration of the above implementation, the mounting portion of the lever is located between the engagement arm and the actuation arm.

Another aspect of the present disclosure includes a node sled for installation into an electronics chassis. The node sled includes a housing containing electronic components. The housing includes a front input/output bracket including ports that permit electrical connection to the electrical components. The front input/output bracket includes a plurality of vent holes for receiving airflow to thermally control the electronic components. The node sled further includes a lever with an engagement arm and an actuation arm. The lever has a low profile and extends along a lower edge of the front input/output bracket so as to avoid impeding the airflow into the plurality of vent holes. The engagement arm locks the node sled to the electronics chassis adjacent to the front input/output bracket. The actuation arm is releasably attached to the front input/output bracket through a latch when the engagement arm is locking the node sled to the electronics chassis.

According to another aspect of the above implementation, the latch has a release portion and a hook portion. The hook portion engages a catch mechanism on the housing when the engagement arm is locking the node sled to the electronics chassis. The release portion is actuated to disengage the hook portion from the catch mechanism.

According to a further aspect of the above implementation, the latch is pivotably connected to the lever. The latch includes a spring mechanism that resists the actuation of the release portion.

According to yet a further aspect of the above implementation, the node sled includes a support bracket assembly mounted on an inside wall of the front input/output bracket. The lever is pivotably mounted to the support bracket assembly.

A further aspect of the present disclosure includes a method of connecting a node sled to an electronics chassis. The method includes inserting the node sled into the electronics chassis. In response to the node sled being at an installation position within the electronics chassis, the method includes actuating a lever to move an engagement arm of the lever into locking engagement with the electronics chassis. The method also includes, in response to the engagement arm being in locking engagement with the electronics chassis, attaching the lever to the housing with a latch mechanism.

According to one aspect of the above implementation, the engagement arm is at one end of the lever, and the latch mechanism attaches the lever to the housing at a second end of the lever. The first end is opposite to the second end.

According to yet a further aspect of the above implementation, the latch mechanism is pivotably mounted to the lever. The latch mechanism includes a hook portion for attachment to the housing.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

Figure 1A:
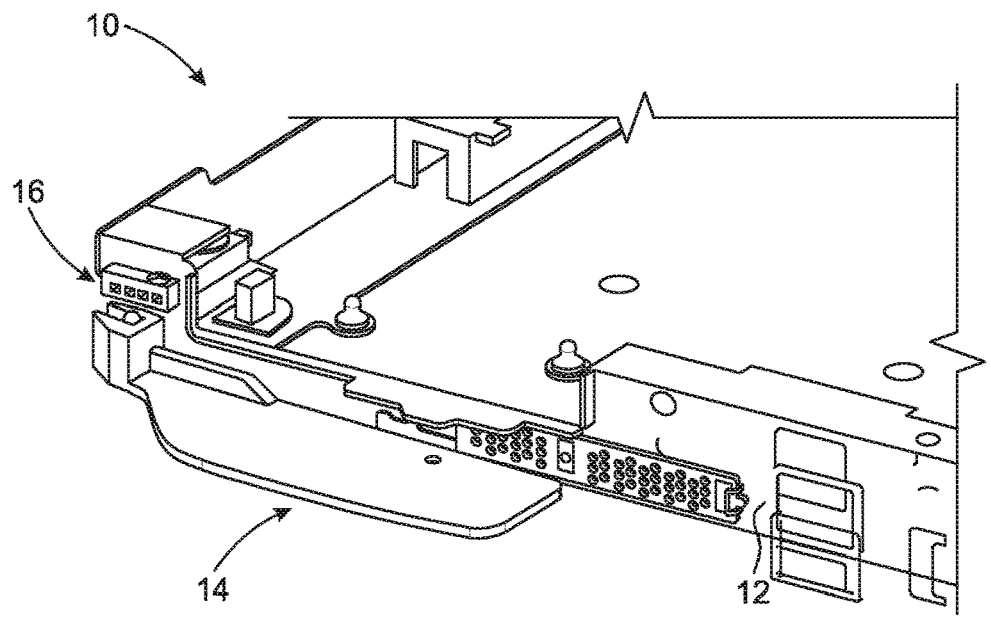
FIG. 1A is a perspective view of an end portion of a single-node sled using a prior art lever mechanism.
Figure 1B:
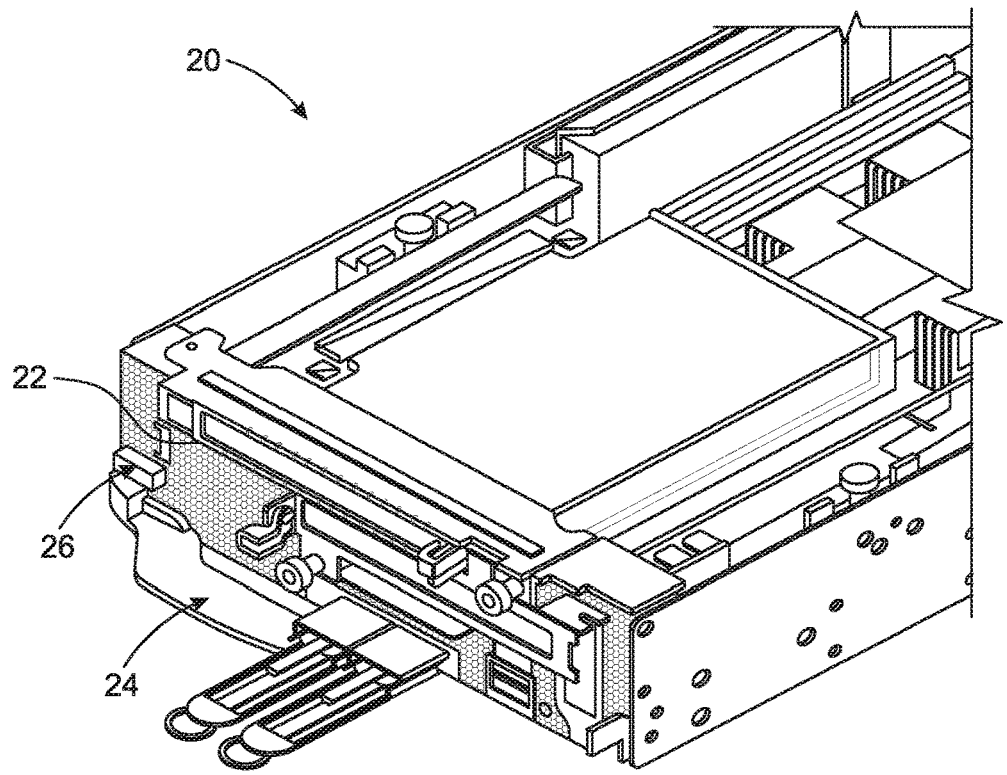
FIG. 1B is a perspective view of an end portion of a dual-node sled using a prior art lever mechanism.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Figure 2:
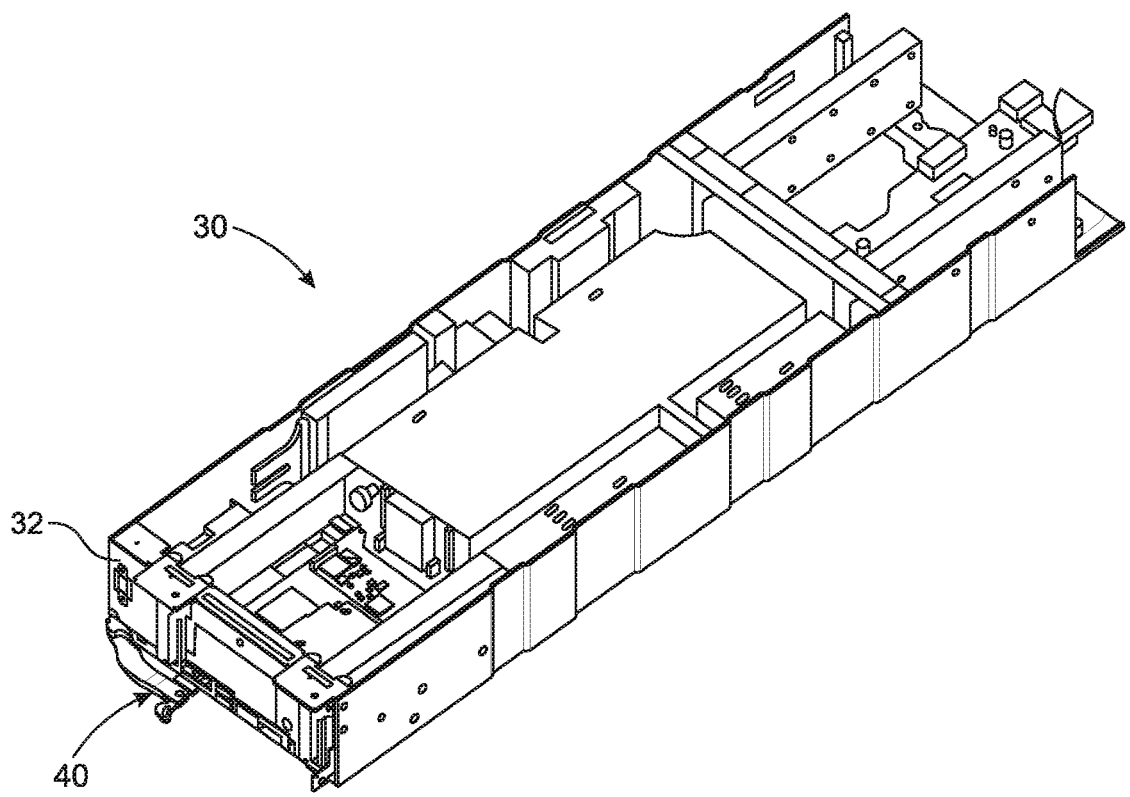
FIG. 2 a perspective view of a dual-node sled using one embodiment of the improved lever mechanism.

FIG. 2 illustrates a dual-node sled 30 having a housing that contains various electronic modules and components. A top cover of the housing of the dual-node sled 30 has been removed in FIG. 2 to reveal the internal electronics. The housing of the dual-node sled 30 includes a removable front bracket 32 that includes various I/O ports, such as USB ports, mini-USB ports, plugs for cards, etc. A lever 40 is located on or adjacent to the front bracket 32. The lever 40 is used for connecting the dual-node sled 30 to an electronic chassis, which is described in more detail in FIGS. 8A-8C.

Figure 3:
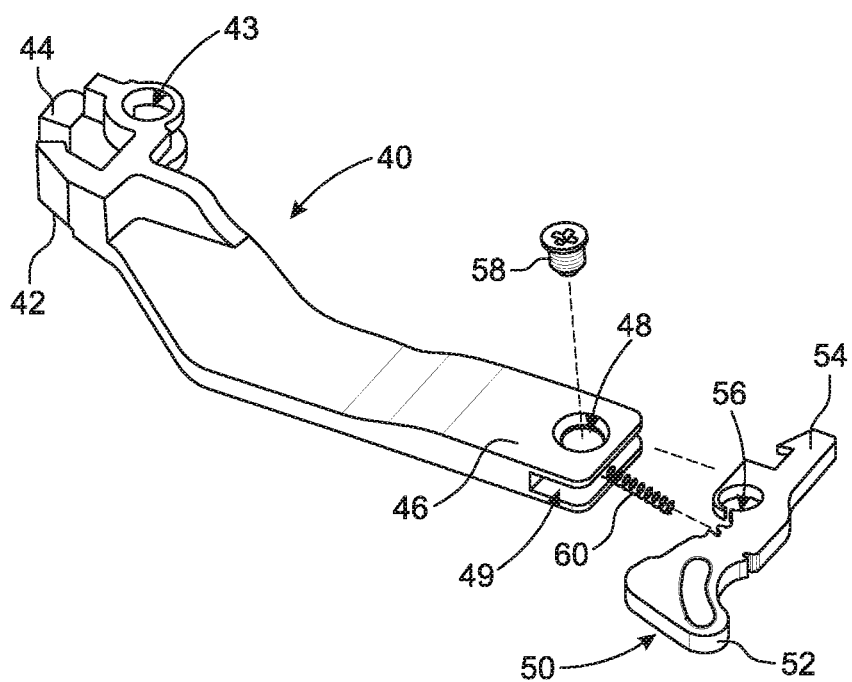
FIG. 3 is an exploded view of the lever mechanism in FIG. 2.
Figure 5:
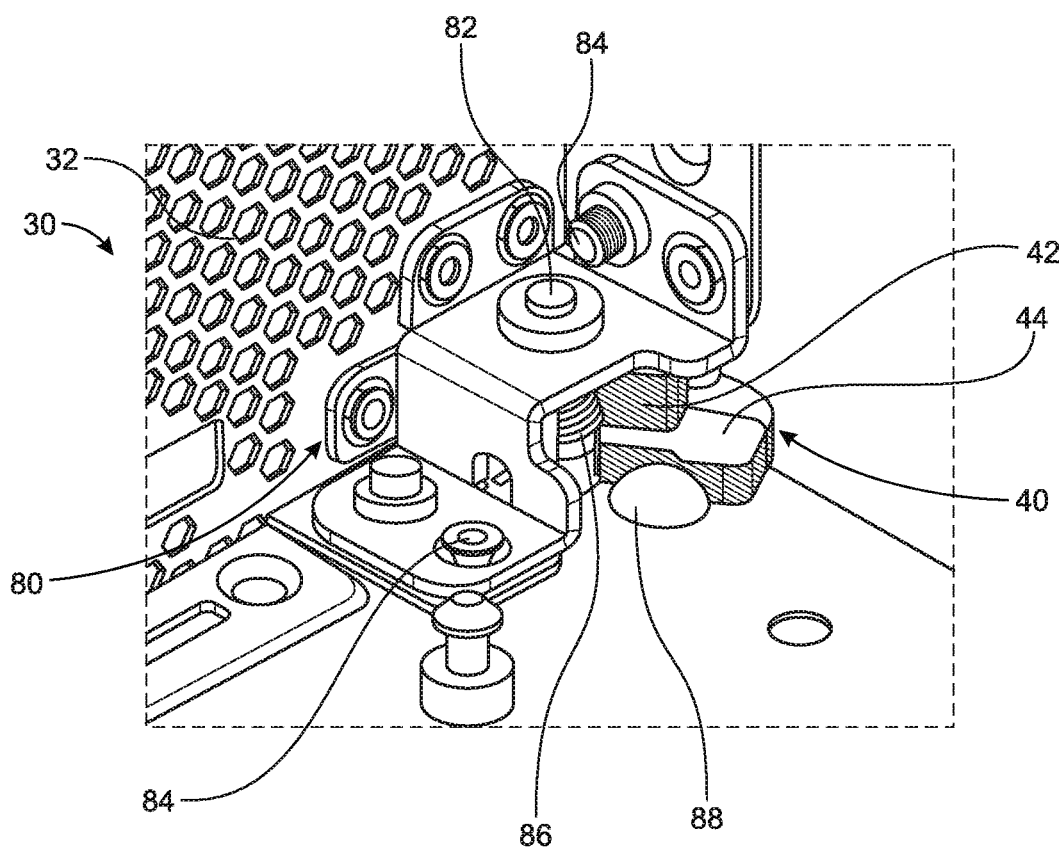
FIG. 5 illustrates a bracket structure in the node sled that is used for mounting the lever mechanism.

FIG. 3 illustrates an exploded view of the lever 40 in FIG. 2. The lever 40 includes a mounting portion 42 that allows the lever 40 to be pivotably mounted to the dual-node sled 30. As shown, the mounting portion 42 includes a hole 43 for receiving a pin structure within the dual-node sled 30, as shown in FIG. 5. The lever 40 rotates around the pin structure. Other mounting techniques can be used as well.

The lever 40 includes an engagement arm 44 that is used to engage the electronic chassis. In the illustrated embodiment, the engagement arm 44 is near the mounting portion 42, but it can be located away from the mounting portion 42 in other embodiments. An actuation arm 46 of the lever 40 is located on the opposing side of the mounting portion 42 relative to the engagement arm 44. Adjacent to its terminal end, the actuation arm 46 includes a bore 48 and a slot 49 for connection to a latch 50.

The latch 50 slides within the slot 49 such that a release portion 52 of the latch 50 is on one side of the lever 40 and a hook portion 54 is on the other side of the lever 40 facing the dual-node sled 30. The latch 50 is retained on the lever 40 by a pin or screw 58 that extends through the bore 48 on the lever 40 and a mounting hole 56 within the central region of the latch 50. The latch 50 can pivot around the screw 58, but is biased to a closed position by a spring mechanism 60 that is held under compression within the slot 49. Hence, when the release portion 52 is manually actuated by a user, the user acts against the force of the spring mechanism 60.

Figure 4A:
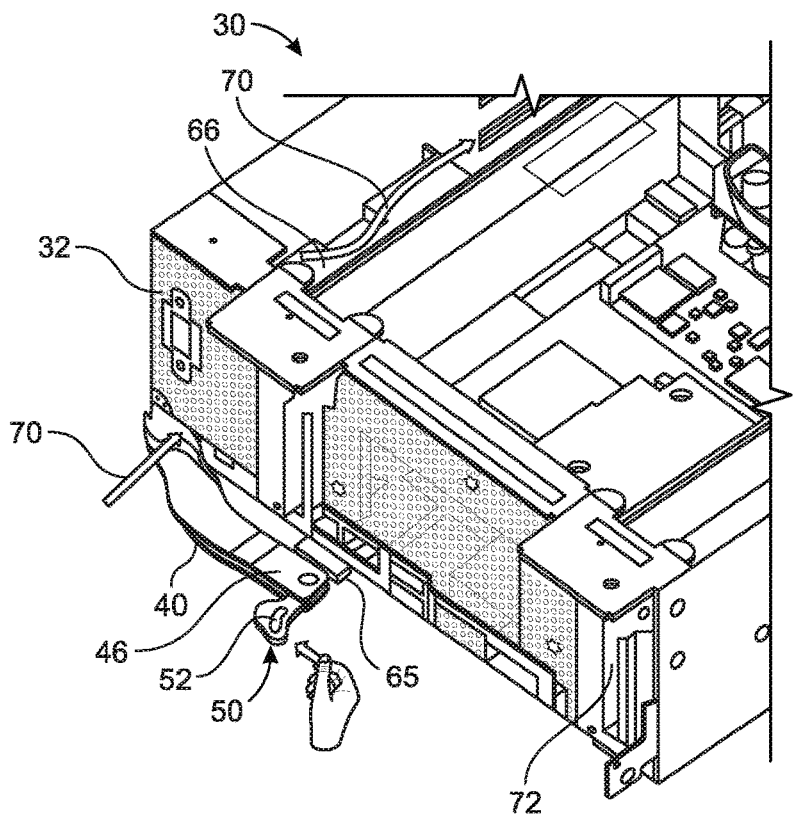
FIG. 4A is a perspective view of an end portion of the dual-node sled of FIG. 2 in which the lever is being released.
Figure 4B:
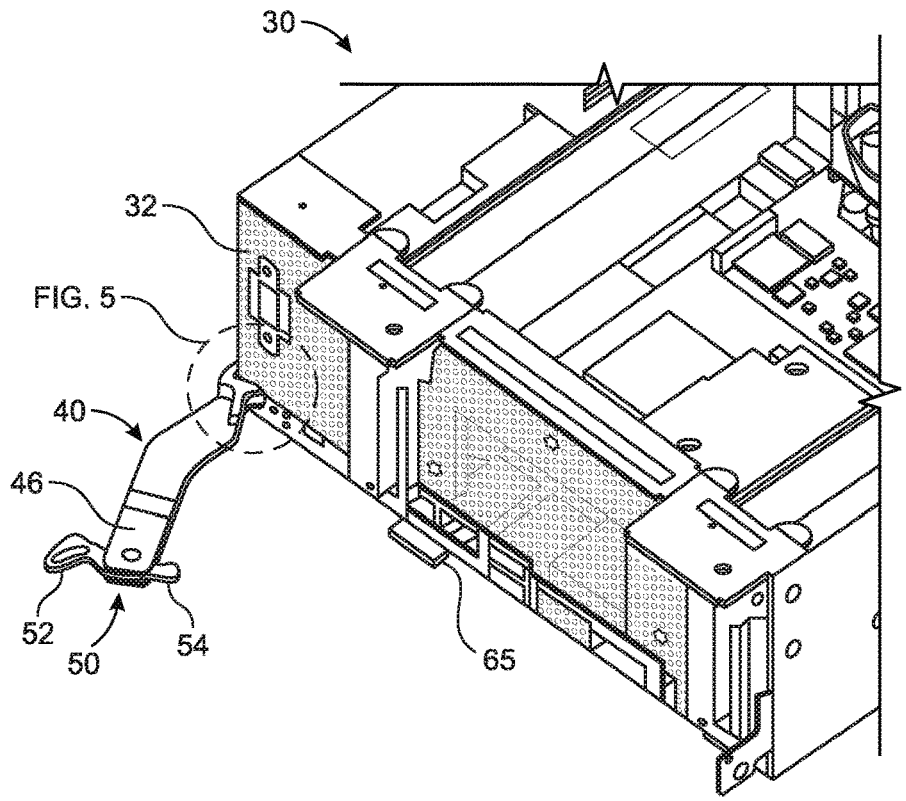
FIG. 4B is a perspective view of the end portion of the dual-node sled of FIG. 2 after the lever has been released.

FIGS. 4A and 4B are perspective views of the dual-node sled 30 with the front bracket 32 shown in more detail. FIG. 4A illustrates the actuation arm 46 (FIG. 3) of the lever 40 in a first position in which the engagement arm 44 (FIG. 3) of the lever 40 locks the dual-node sled 30 to the electronics chassis. FIG. 4B illustrates the actuation arm 46 (FIG. 3) of the lever 50 in a second position in which the engagement arm 44 (FIG. 3) of the lever 40 is released from the electronics chassis. As shown in FIG. 4A, the user applies a force to the release portion 52 of the latch 50, causing the hook portion 54 (not shown in FIG. 4A) of the latch 50 to be released from a catch mechanism 65 on the front bracket 32. As shown in FIG. 4B, once the hook portion 54 of the latch 50 is released from the catch mechanism 65, the lever 40 rotates away from the front bracket 32. As such, the dual-node sled 30 does not require any tools to release it from the electronics chassis.

FIG. 4A also helps to illustrate one of the thermal-control advantages of the lever 40. In the illustrated embodiment, the dual-node sled 30 includes a baseboard management controller (BMC) 66, which may include carrier boards (e.g., M.2/M.3 carriers). The BMC 66 is an example of an electronic component commonly contained in the dual-node sled 30 that produces a substantial amount of heat. Because of the low profile of the lever 40 and the fact that it does not require a larger button mechanism for releasing the lever 40 as present in prior art systems, there is more exposed area for air vents on the front bracket 32 to receive airflow 70 (shown as a straight arrow) from outside the dual-node sled 30. Due to the increased rate of airflow 70 into the air vents above the lever 40, the transfer of heat from the BMC 66 (and other components) through convection from the airflow 70 (shown as a curved arrow near BMC 66) within the dual-node sled 30 is enhanced. For example, the airflow rate in this region can be increased by 15% due to the design of the lever 40 relative to the prior lever systems. Thus, the power to the BMC 66 and other cards can be increased. It should be understood that the entirety of the front bracket 32 cannot include air vents due to other required components, such as the various I/O ports. The front bracket 32 may also require other busses and interconnect assemblies, such as peripheral component interconnect express (PCIe) slots 72, for receiving cards and drives. Accordingly, by minimizing the area of the front bracket 32 required for the lever 40, more area can also be used for other I/O components.

FIG. 5 illustrates the interior of the dual-node sled 30 in the corner region that is circled in FIG. 4B. A mounting bracket assembly 80 for the lever 40 is attached to three inside surfaces of the front bracket 32. The mounting bracket assembly 80 includes a pin 82 that fits through the hole 43

(FIG. 3) in the mounting portion 42 of the lever 40. The mounting bracket assembly 80 includes a plurality of fasteners 84 for retention on the front bracket 32. The fasteners 84 may include rivets, screws, and/or threaded caps for receiving screws. As shown in FIG. 5, the fasteners 84 include five rivets and two threaded caps. The threaded caps receive screws from the exterior of the dual-node sled 30 that retain the entire front bracket 32 on the dual-node sled 30. Hence, when those screws are removed, the front bracket 32 can be removed from the dual-node sled 30, but the mounting bracket assembly 80 and the lever 40 still remain attached to the front bracket 32 by the five rivets.

To bias the actuation arm 46 of the lever 40 toward the opened position (FIG. 4B), a spring mechanism 86 of the mounting bracket assembly 80 acts upon the mounting portion 42 of the lever 40. A stop element 88 limits the rotational movement of lever 40 around the pin 82. The stop element 88 contacts the engagement arm 44 as it rotates into the interior of the housing of the dual-node sled 30 as the lever 40 moves to the opened position. The stop element 88 limits the total rotational movement of the lever 40 between the first locked position (FIG. 4A) and the second released position (FIG. 4B) to about 80°.

Due to attachment to the front bracket 32 on three different sides, the mounting bracket assembly 80 provides enhanced structural support for the lever 40. As such, there is less risk of accidental disengagement of the lever 40, or deformation of the lever 40 or the front bracket 32 due to shock and/or vibration. Furthermore, the attachment of the opposing end of the lever 40 to the front bracket 32 by the latch 50 provides additional structural integrity to the lever 40. Consequently, the combination of the mounting bracket assembly 80 that secures the lever 40 at one end, and the latch 50 that secures the lever 40 at its other end, provides more reliability to the node sleds during transportation and operation. Compared to prior lever systems which experienced problems when subjected to 20G shock tests, the lever 40 is capable of surviving 20G shock tests to the node sled.

Figure 6:
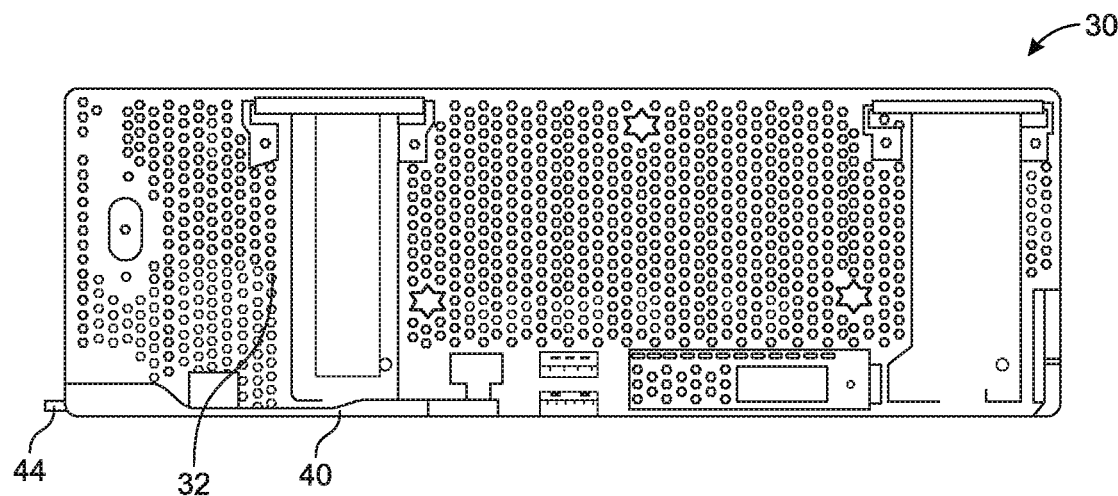
FIG. 6 is a front view of the dual-node sled with the lever mechanism.
Figure 7:
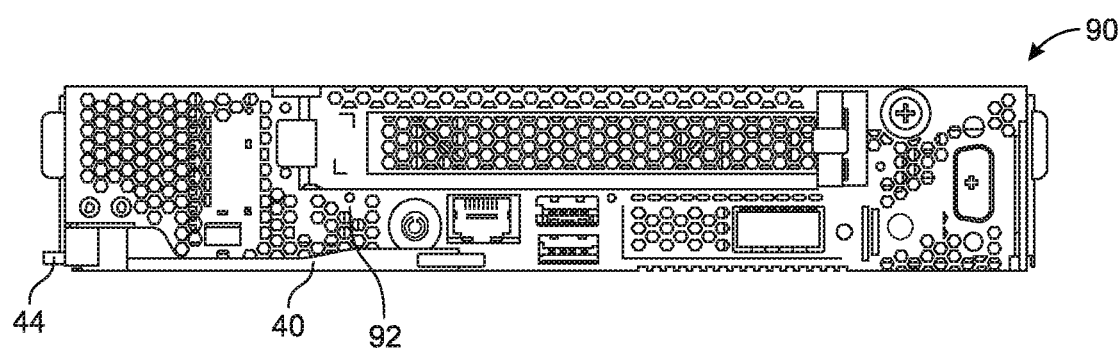
FIG. 7 is a front view of the single-node sled with the lever mechanism.

FIGS. 6 and 7 illustrate, respectively, a front view of the dual-node sled 30 that has been previously described and a front view of a single-node sled 90. The lever 40 has modularity because the same lever 40 can be used on different types of dual-node sleds 30 and different types of single-node sleds 90. Different node sleds 30, 90 may serve different functions (e.g., a motherboard sled, a hard disk drive (HDD) sled, a dummy HDD sled, etc.) As shown in FIG. 6, the lever 40 has a low profile that extends along the lower edge of the front bracket 32. Similarly, in FIG. 7, the lever 40 has a low profile that extends along the lower edge on the front bracket 92 of the single-node sled 90. The engagement arm 44 of the lever extends the same distance outwardly away from the housings for both the dual-node sled 30 and the single-node sled 90.

From a geometric perspective, the dual-node sled 30 of FIG. 6 and the single-node sled 90 of FIG. 7 have the same width, but the dual-node sled 30 has twice the height as the single-node sled 90. In one embodiment, the width of both the dual-node sled 30 and the single-node sled 90 is about 212 mm, the height of the dual-node sled 30 is about 80 mm, and the height of the single-node sled 90 is about 40 mm.

Figure 8A:
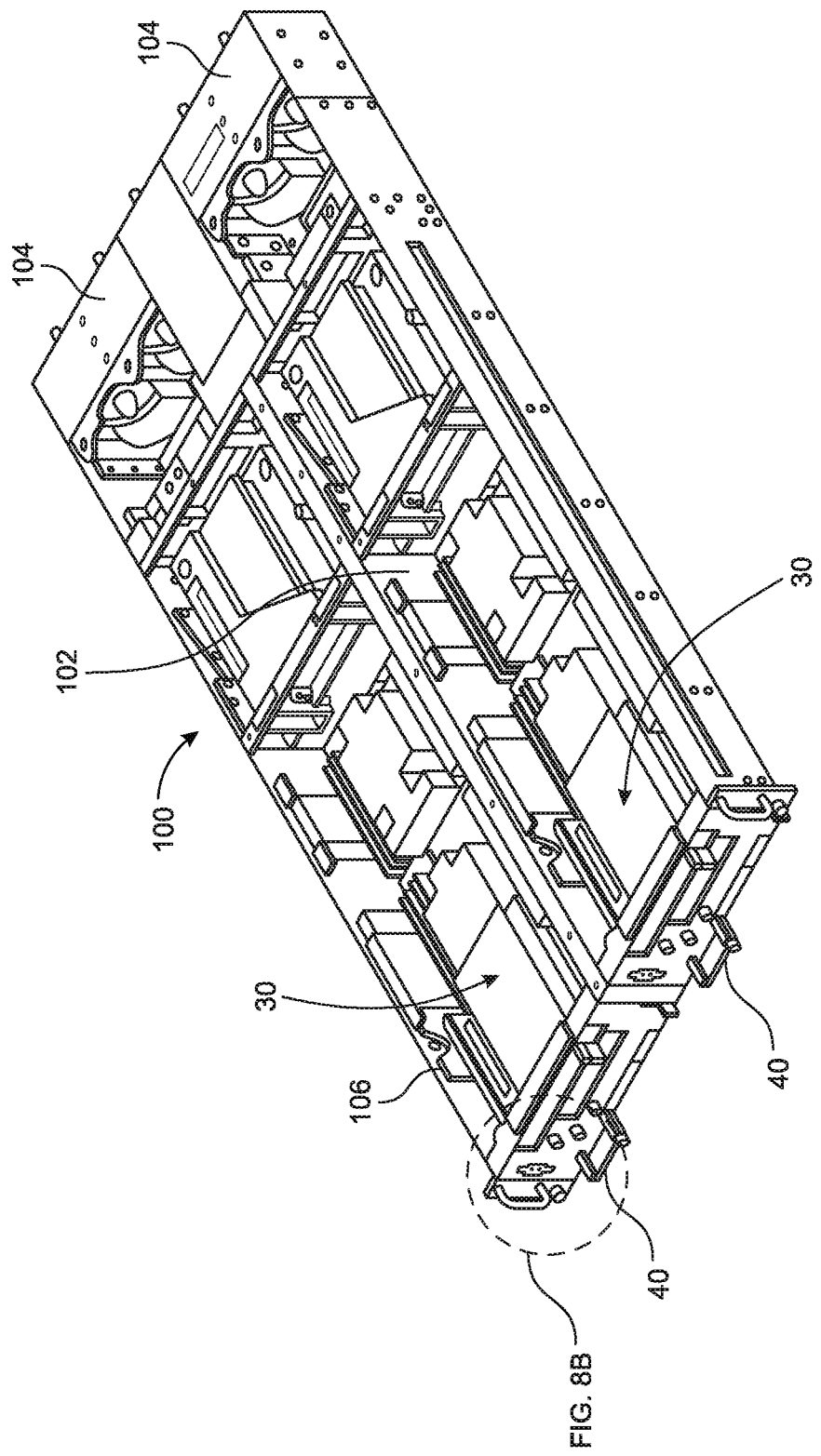
FIG. 8A illustrates an electronics chassis for receiving a single-node sled or a dual-node sled.
Figure 8B:
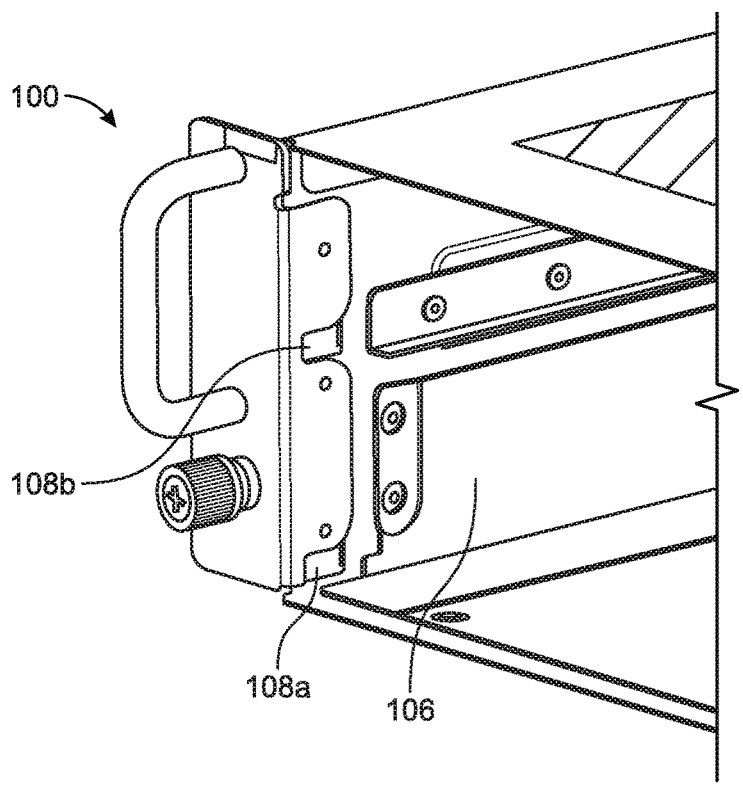
FIG. 8B illustrates an interior front region of only the electronics chassis of FIG. 8A before a node sled has been installed.
Figure 8C:
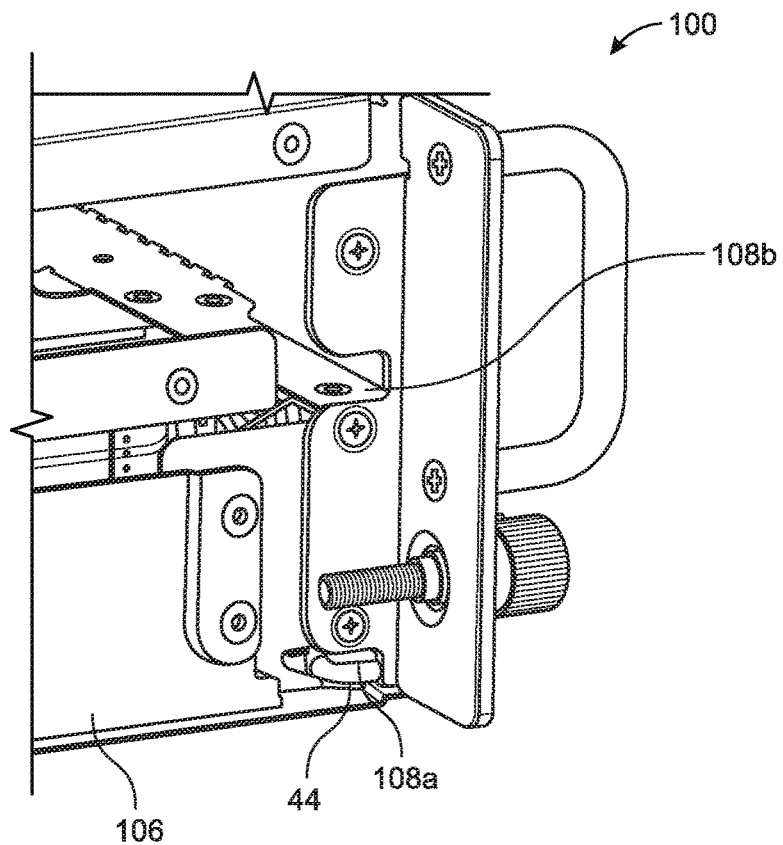
FIG. 8C illustrates the connection of the lever mechanism of the node sled and the electronics chassis.

FIGS. 8A, 8B, and 8C illustrate an electronics chassis 100 that can accommodate the dual-node sled 30 or the single-node sled 90 (shown in FIG. 7). As illustrated in FIG. 8A, the electronics chassis 100 includes a central wall 102 extending along its length. Two dual-node sleds 30 are located side-by-side within the electronics chassis 100 on either side of the central wall 102. Each dual-node sled 30 slides into the enclosure of the electronics chassis 100. Each dual-node sled 30 includes connectors on its back side opposing the front bracket 32 that mate with electrical and mechanical connectors of the electronics chassis 100. When the dual-node sled 30 are placed into their final installation positions within the electronics chassis 100, the lever 40 for each dual-node sled 30 then locks it to the central wall 102 or an outer wall 106 of the electronics chassis 100. During operation, fans 104 within the electronics chassis 100 draw air into the front bracket 32 of the dual-node sleds 30, as shown in FIG. 4A.

FIG. 8B is an interior view of the corner of the electronics chassis 100 of FIG. 8A without the dual-node sleds 30 being installed. The outer wall 106 includes a lower opening 108a and an upper opening 108b that can receive the engagement arm 44 of the lever 40 (both in FIG. 3). FIG. 8C is an exterior view of the corner of the electronics chassis 100 with the engagement arm 44 of the lever 40 (both FIG. 3) shown in the locked position within the lower opening 108a. When the electronics chassis 100 accommodates the dual-node sled 30 (in FIG. 8A), only the lower opening 108a is used for locking the engagement arm 44 of the lever 40 of the dual-node sled 30. When the electronics chassis 100 accommodates a pair of single-node sleds 90 (FIG. 7) that are stacked, the lower opening 108a is used for locking the engagement arm 44 of the lever 40 of the lower single-node sled 90. The upper opening 108b is used for locking the engagement arm 44 of the lever 40 of the upper single-node sled 90. Though not shown in FIG. 8A, the central wall 102 would also have a pair of openings corresponding to the node sleds on the right-hand side of the electronics chassis 100 in FIG. 8A.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A node sled for installation into an electronics chassis, comprising:
    an housing containing electronic components, the housing including a front bracket and a catch mechanism; and
    a lever having an engagement arm, an actuation arm, and a mounting portion, the mounting portion being pivotably mounted to the housing, the actuation arm being manually moveable between a first position in which the engagement arm locks the node sled into the electronics chassis and a second position in which the engagement arm is released from the electronics chassis, the actuation arm having a latch that engages the catch mechanism in response to the actuation arm being in the first position.

2. The node sled of claim 1, wherein the latch has a release portion and a hook portion, the hook portion engaging the catch mechanism in response to the actuation arm being in the first position.

3. The node sled of claim 2, wherein the latch has a connection region at which the latch is pivotably connected to the engagement arm, the release portion being on one side of the connection region and the hook portion being on the other side of the connection region.

4. The node sled of claim 3, wherein, in response to the release portion of the latch being manually actuated, the hook portion disengages from the catch mechanism and the engagement arm moves toward the second position.

5. The node sled of claim 4, wherein the lever further includes a spring mechanism to bias the engagement arm of the lever toward the second position.

6. The node sled of claim 1, wherein the mounting portion is pivotably mounted to the front bracket of the housing.

7. The node sled of claim 6, wherein the front bracket is removable from the housing.

8. The node sled of claim 6, further including a support bracket assembly mounted on an inside wall of the front bracket of the housing, the support bracket assembly including a pin structure that pivotably mates with an opening in the mounting portion of the lever.

9. The node sled of claim 8, wherein the support bracket assembly includes a spring mechanism, the spring mechanism causing the actuation arm of the lever to be biased toward the second position.

10. The node sled of claim 1, wherein the lever has a low profile and extends along a bottom edge on the front bracket.

11. The node sled of claim 10, wherein the front bracket includes a plurality of air vents directly above the lever.

12. The node sled of claim 11, wherein the electronic components include a baseboard management controller, the plurality of air vents being directly adjacent to the baseboard management controller.

13. The node sled of claim 1, wherein the mounting portion of the lever is located between the engagement arm and the actuation arm.

14. A node sled for installation into an electronics chassis, comprising:
    a housing containing electronic components, the housing including a front input/output bracket including ports that permit electrical connection to the electrical components, the front input/output bracket including a plurality of vent holes for receiving airflow to thermally control the electronic components; and
    a lever having an engagement arm and an actuation arm, the lever having a low profile and extending along a lower edge of the front input/output bracket so as to avoid impeding the airflow into the plurality of vent holes, the engagement arm locking the node sled to the electronics chassis adjacent to the front input/output bracket, the actuation arm being releasably attached to the front input/output bracket through a latch when the engagement arm is locking the node sled to the electronics chassis.

15. The node sled of claim 14, wherein the latch has a release portion and a hook portion, the hook portion engaging a catch mechanism on the housing when the engagement arm is locking the node sled to the electronics chassis, the release portion being actuated to disengage the hook portion from the catch mechanism.

16. The node sled of claim 15, wherein the latch is pivotably connected to the lever, the latch includes a spring mechanism that resists the actuation of the release portion.

17. The node sled of claim 14, further including a support bracket assembly mounted on an inside wall of the front input/output bracket, the lever being pivotably mounted to the support bracket assembly.

18. A method of connecting a node sled to an electronics chassis, the method comprising:
    inserting the node sled into the electronics chassis;
    in response to the node sled being at an installation position in the electronics chassis, actuating a lever to move an engagement arm of the lever into locking engagement with the electronics chassis; and
    in response to the engagement arm being in locking engagement with the electronics chassis, attaching the lever to the housing with a latch mechanism.

19. The method of claim 18, wherein the engagement arm is at one end of the lever and the latch mechanism attaches the lever to the housing at a second end of the lever, the first end being opposite of the second end.

20. The method of claim 18, wherein the latch mechanism is pivotably mounted to the lever, the latch mechanism includes a hook portion for attachment to the housing.

* * * * *